United States Patent
Cho et al.

(10) Patent No.: US 11,150,561 B2
(45) Date of Patent: Oct. 19, 2021

(54) METHOD AND APPARATUS FOR COLLECTING INFORMATION USED IN IMAGE-ERROR COMPENSATION

(71) Applicant: Taiwan Semiconductor Manufacturing Co., Ltd., Hsinchu (TW)

(72) Inventors: Hung-Wen Cho, Hsinchu (TW); Fu-Jye Liang, Zhubei (TW); Chun-Kuang Chen, Guanxi Township, Hsinchu County (TW); Chih-Tsung Shih, Hsinchu (TW); Li-Jui Chen, Hsinchu (TW); Po-Chung Cheng, Zhongpu Township, Chiayi County (TW); Chin-Hsiang Lin, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/927,131

(22) Filed: Jul. 13, 2020

(65) Prior Publication Data

US 2020/0348586 A1   Nov. 5, 2020

Related U.S. Application Data

(62) Division of application No. 15/906,586, filed on Feb. 27, 2018, now Pat. No. 10,712,651.

(60) Provisional application No. 62/583,129, filed on Nov. 8, 2017.

(51) Int. Cl.

| | |
|---|---|
| *G03F 7/20* | (2006.01) |
| *G03F 7/22* | (2006.01) |
| *G03F 1/22* | (2012.01) |
| *G03F 1/44* | (2012.01) |
| *G03F 1/36* | (2012.01) |
| *G06T 7/00* | (2017.01) |

(52) U.S. Cl.
CPC ........ *G03F 7/70441* (2013.01); *G03F 7/2004* (2013.01); *G03F 7/70483* (2013.01); *G03F 1/22* (2013.01); *G03F 1/36* (2013.01); *G03F 1/44* (2013.01); *G03F 7/22* (2013.01); *G06T 7/001* (2013.01); *G06T 2207/10061* (2013.01); *G06T 2207/30148* (2013.01)

(58) Field of Classification Search
CPC ..... G03F 1/22; G03F 1/36; G03F 1/44; G03F 7/2004; G03F 7/70441; G03F 7/70483
USPC ........................................................... 430/30
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 10,712,651 B2 * | 7/2020 | Cho | G03F 1/44 |

* cited by examiner

*Primary Examiner* — Christopher G Young
(74) *Attorney, Agent, or Firm* — Birch, Stewart, Kolasch & Birch, LLP

(57) ABSTRACT

A method for collecting information in image-error compensation is provided. The method includes providing a reticle having a first image structure and a second image structure; moving a light shading member to control a first exposure field; projecting a light over the first exposure field; recording an image of the first image structure after the light is projected; moving the light shading member to control a second exposure field; projecting the light over the second exposure field; and recording an image of the second image structure after the light is projected.

20 Claims, 11 Drawing Sheets

METHOD AND APPARATUS FOR COLLECTING INFORMATION USED IN IMAGE-ERROR COMPENSATION

PRIORITY CLAIM AND CROSS-REFERENCE

This application is a Divisional of U.S. patent application Ser. No. 15/906,586, filed on Feb. 27, 2018, which claims priority to U.S. Provisional Application No. 62/583,129, filed on Nov. 8, 2017, the entirety of which are incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposure process forms a patterned photoresist layer for various patterning processes, such as etching or ion implantation. In a typical lithography process, a photosensitive layer (resist) is applied to a surface of a semiconductor substrate, and an image of features defining parts of the semiconductor device is provided on the layer by exposing the layer to a pattern of light.

Advanced lithography processes have been developed to achieve smaller geometric sizes. For example, the use of extreme ultraviolet (EUV) lithography has been proposed to achieve small geometric sizes. Due to the heavy absorption of EUV radiation by certain substances, an EUV lithography system typically uses a reflective optics apparatus to carry out the lithography processes. However, conventional EUV lithography systems may suffer from the penumbra effect, which may lead to issues with device pattern uniformity or otherwise degrade lithographic performance.

Therefore, while existing lithography exposure apparatuses and processes have been generally adequate for their intended purposes, they are not entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
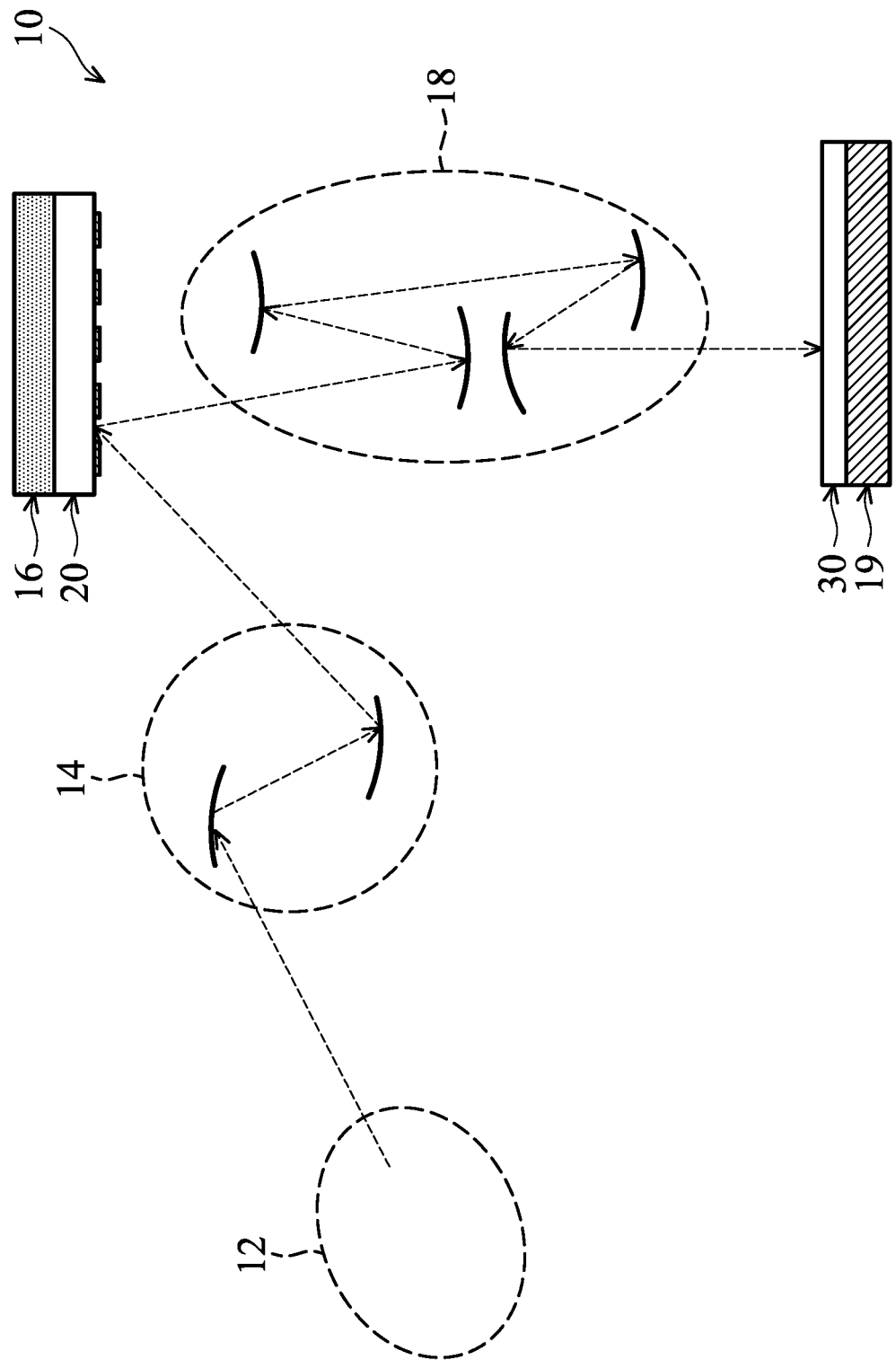
FIG. 1 is a schematic and diagrammatic view of a lithography system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a lithography system 10, in accordance with some embodiments. The lithography system 10 may also be generically referred to as a scanner that is operable to perform lithography exposing processes with respective radiation source and exposure mode.

The lithography system 10 includes a light source 12, an illuminator 14, a reticle stage 16, a projection optics module (or projection optics box (POB)) 18 and a substrate stage 19, in accordance with some embodiments. The elements of the lithography system 10 can be added to or omitted, and the invention should not be limited by the embodiment.

The light source 12 is configured to generate radians having a wavelength ranging between about 1 nm and about 100 nm. In one particular example, the light source 12 generates an EUV (extreme ultraviolet) light with a wavelength centered at about 13.5 nm. Accordingly, the light source 12 is also referred to as an EUV light source. However, it should be appreciated that the light source 12 should not be limited to emitting EUV light. The light source 12 can be utilized to perform any high-intensity photon emission from excited target material.

In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the light source 12 onto the reticle stage 16, particularly to a reticle 20 secured on the reticle stage 16. In the present embodiment where the light source 12 generates light in the EUV wavelength range, reflective optics is employed.

The reticle stage 16 is configured to secure the reticle 20. In some embodiments, the reticle stage 16 includes an electrostatic chuck (e-chuck) to secure the reticle 20. This is because the gas molecules absorb EUV light and the lithography system for the EUV lithography patterning is maintained in a vacuum environment to avoid EUV intensity loss. In the present disclosure, the terms mask, photomask, and reticle are used interchangeably. The reticle 20 secured on the reticle stage 16 may be covered by a pellicle (not shown in figure) for mitigate particle issue.

The projection optics module (or projection optics box (POB)) 18 is configured for imaging the pattern of the reticle 20 on to a semiconductor wafer 30 secured on the substrate stage 19 of the lithography system 10. In some embodiments, the POB 18 has refractive optics (such as for a UV lithography system) or alternatively reflective optics (such as for an EUV lithography system) in various embodiments. The light directed from the reticle 20, carrying the image of the pattern defined on the mask, is collected by the POB 18. The illuminator 14 and the POB 18 are collectively referred to as an optical module of the lithography system 10.

In some embodiments, the lithography system 10 further includes a number of actuators (not shown in the figures) connected to the illuminator 14 and the POB 18 to adjust the position of optic elements of the illuminator 14 and the POB 18. The actuators are electrically connected to the controlling apparatus (not shown in figures). In addition, the actuator is controlled to drive the movement of the optic elements of the illuminator 14 and the POB 18 according the signals issued by the controlling apparatus. As a result, the focal length of the light scanned over the semiconductor wafer 30 can be adjusted.

Figure 2:
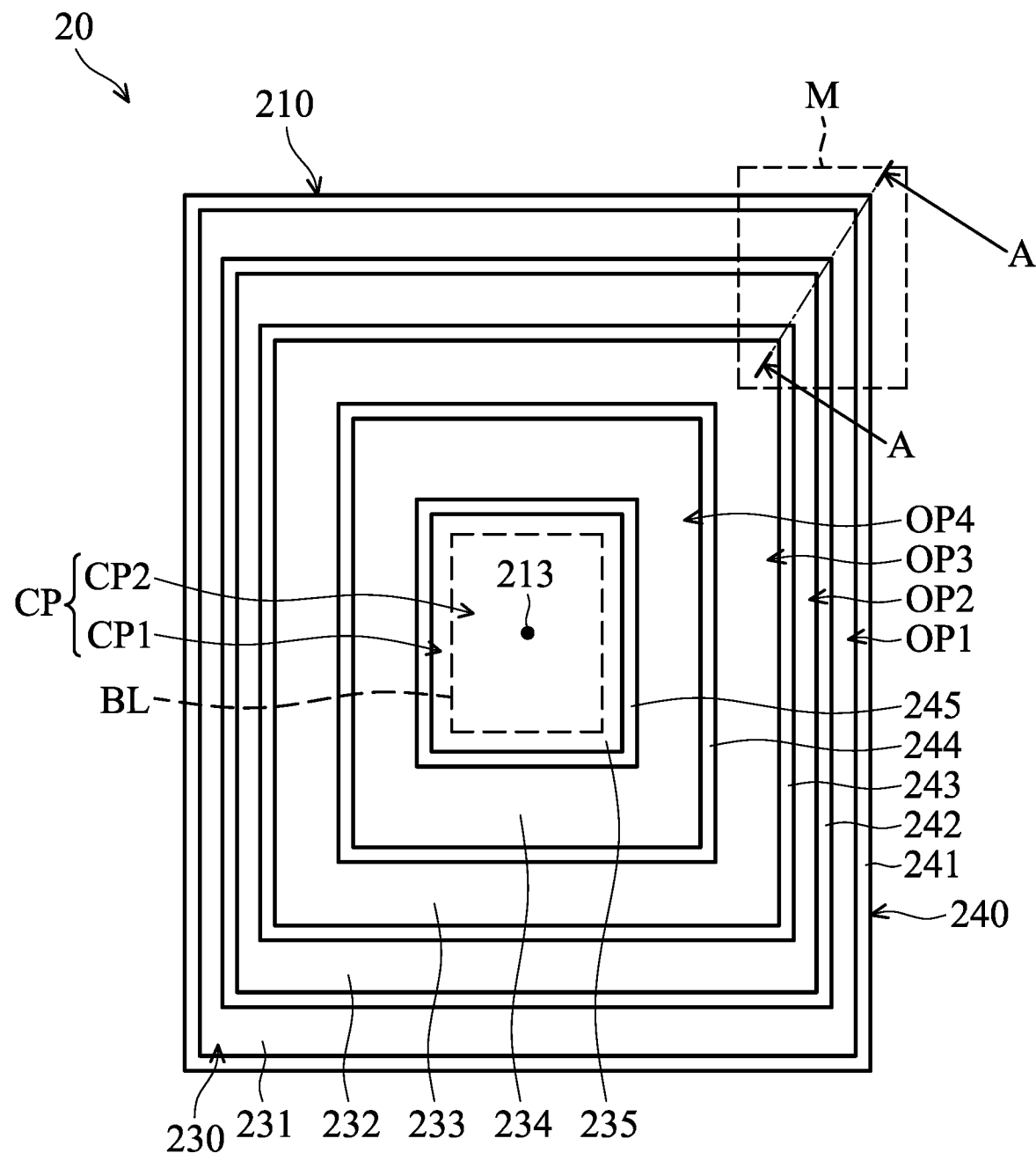
FIG. 2 is a schematic view of a reticle, in accordance with some embodiments.
Figure 3:
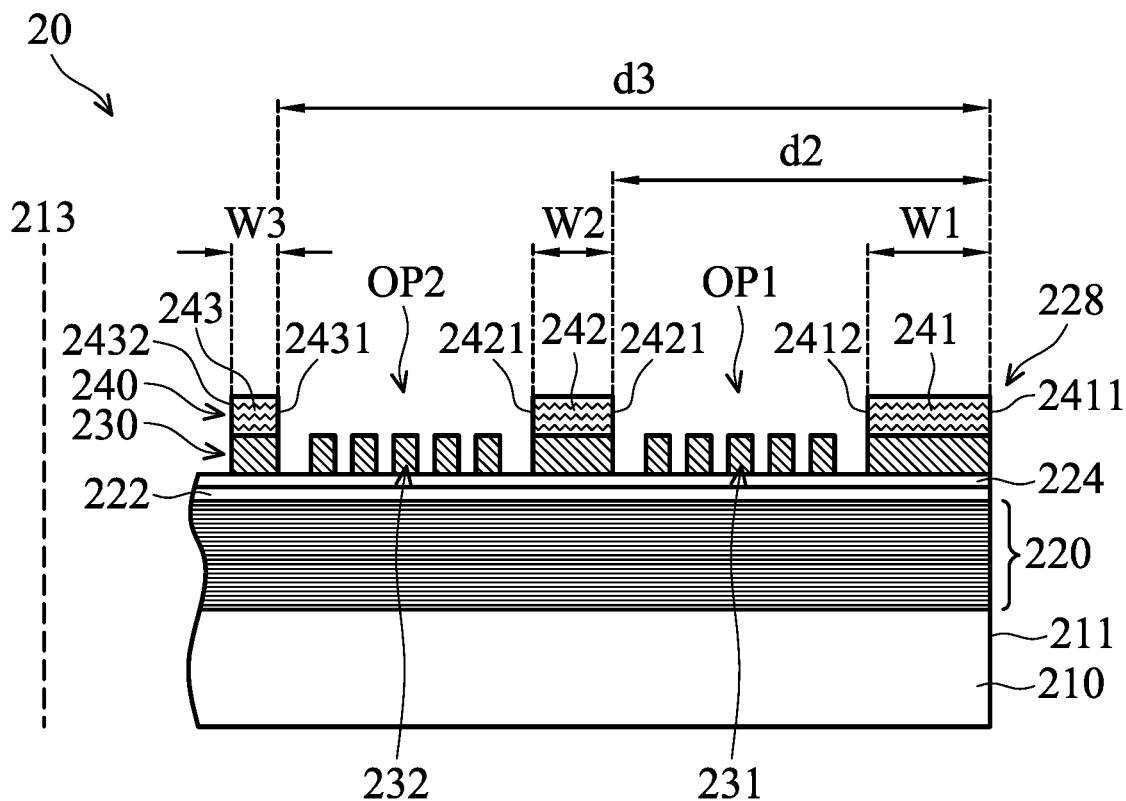
FIG. 3 is a cross-sectional view of the reticle taken along line A-A of FIG. 2.

FIG. 2 shows a top view of the reticle 20, in accordance with some embodiments, and FIG. 3 shows a cross-sectional view of the reticle 20 taken along line A-A of FIG. 2. In some embodiments, as shown in FIG. 3, the reticle 20 includes a substrate 210, a reflective multilayer 220 (also referred to as a multilayer mirror (MLM)), a capping layer 222, a buffer layer 224 and an absorption stack 228. Additional features can be added in the reticle 20, and some of the features described below can be replaced or omitted in alternative embodiments of the reticle 20.

The substrate 210 may be made with a suitable material, such as a low thermal expansion material (LTEM) or fused quartz. In various examples, the LTEM includes $TiO_2$ doped $SiO_2$, or other suitable materials with low thermal expansion.

The reflective multilayer 220 is disposed over the substrate 210, particularly over the surface 212 of the substrate 210. The reflective multilayer 220 includes a number of material layer/film pairs, where each pair includes at least two material layers having different refractive indices. A typical number of film pairs is about twenty to about eighty pairs, however, the reflective multilayer 220 may have any number of film pairs.

The material of the at least two material layers is selected such that the reflective multilayer 220 exhibits high reflectivity to a particular radiation type/wavelength. In the embodiment depicted, the reflective multilayer 220 includes material layer pairs that exhibit high reflectivity to EUV radiation. For example, the reflective multilayer 220 includes molybdenum-silicon (Mo/Si) film pairs (in other words, each pair includes a molybdenum layer disposed above or below a silicon layer). In one example, the reflective multilayer 220 includes forty Mo/Si film pairs. Alternatively, the reflective multilayer 220 includes molybdenum-beryllium (Mo/Be) film pairs, or any other combination of material film pairs that exhibit high reflectivity at EUV wavelengths.

A thickness of the reflective multilayer 220 may be adjusted to achieve maximum constructive interference of the EUV radiation reflected at each interface of the film pairs while achieving a minimum absorption of the EUV radiation by the reflective multilayer 220. A thickness of each layer of the reflective multilayer 220 is determined based on the type of EUV radiation and incident angle of the EUV radiation projected onto the reticle 20. In the embodiment depicted, each of the molybdenum layers and the silicon layers of the Mo/Si film pairs have a thickness of about 4 nm to about 7 nm.

The capping layer 222 includes a silicon-containing material, such as silicon. In one example, the capping layer 222 is a silicon layer of a topmost Mo/Si film pair of the reflective multilayer 220. The capping layer 222 can prevent oxidation of the reflective multilayer 220, for example, during processing of the reticle 20. Alternatively, the capping layer 222 may include other material that prevents oxidation of the reflective multilayer 220. In one example, the capping layer 222 has a thickness of about 4 nm to about 7 nm.

The buffer layer 224 is disposed over the capping layer 222. The buffer layer 224 includes a material that protects the reflective multilayer 220 during processing of the reticle 20 (for example, during etching of an absorption layer of the reticle 20). In the embodiment depicted, the buffer layer 224 includes a ruthenium-containing material, such as Ru, RuNb, RuZr, RuMo, RuY, RuB, RuTi, RuLa, other ruthenium-containing material, or combinations thereof.

Alternatively, the buffer layer 224 includes a chromium-containing material, such as Cr, CrN, CrO, CrC, CrON, CrCN, CrOC, CrOCN, other chromium-containing material, or combinations thereof. In yet another alternative, the buffer layer 224 includes materials other than ruthenium-containing materials and chromium-containing materials. The buffer layer 224 may include a combination of ruthenium-containing material, chromium-containing material, and other material, for example, where the buffer layer 224 includes multiple layers made of various materials. In one example, the buffer layer 224 has a thickness of about 1 nm to about 5 nm. It should be noted that, in alternative embodiments, the capping layer 222 and buffer layer 224 may be a single layer.

In some embodiments, the absorption stack 228 includes one or more layers designed to absorb radiation in the radiation type/wavelength range projected onto the reticle 20. For example, as shown in FIG. absorption stack 228 includes an absorber layer 230 disposed over the buffer layer 224, and an absorber layer 240 disposed over the absorber layer 230. The absorber layer 230 and the absorber layer 240 are patterned by photolithography exposure process to have particular patterns which is desired to be image on the semiconductor wafer 30.

In some embodiments, as shown in FIG. 2, the absorber layer 240 is patterned to have a number of black border structures for defining different field sizes on the reticle 20, including, e.g., first black border structure 241, second black border structure 242, third black border structure 243, fourth black border structure 244 and fifth black border structure 245.

The first black border structure 241, the second black border structure 242, the third black border structure 243, the fourth black border structure 244 and the fifth black border structure 245 may be concentrically arranged over the substrate 210 and surround the center 213 of the substrate 210 as shown in FIG. 2. In such embodiments, the first black border structure 241, the second black border structure 242, the third black border structure 243, the fourth black border structure 244 and the fifth black border structure 245 may be rectangular with sides correspondingly parallel to the edges of the substrate 210.

In some embodiments, an intervening space is formed between two neighboring black border structures, and the two neighboring black border structures are not connected to each other. For example, as shown in FIG. 3, an outer edge 2411 of the first black border structure 241 is aligned with the outer edge 211 of the substrate 210, and there is a width W1 from the inner edge 2412 to the outer edge 2411 of the first black border structure 241. In addition, the outer edge 2421 of the second black border structure 242 is located at a distance d2 away from the outer edge 211 of the substrate 210. The distance d2 is greater than the width W1. As a result, a first intervening space OP1 is formed between the first black border structure 241 and the second black border structure 242.

Moreover, the outer edge 2431 of the third black border structure 243 is located a distance d3 away from the outer edge 211 of the substrate 210. The distance d3 is greater than a sum of the width W2 of the second black border structure 242 and the distance d2. As a result, a second intervening space OP2 is formed between the second black border structure 242 and the third black border structure 243.

Similarly, as shown in FIG. 2, there is a third intervening space OP3 formed between the third black border structure 243 and the fourth black border structure 244, and there is a fourth intervening space OP4 formed between the fourth black border structure 244 and the fifth black border structure 245. The intervening spaces OP1, OP2, OP3, and OP4 have ring shape, and the width of the intervening spaces OP1, OP2, OP3, and OP4 may be in a ranged from about 1.0 mm to about 1.75 mm.

In some embodiments, a central space is surrounded by the inner most black border structure of the absorber layer 240. For example, a central space CP is surrounded by the fifth black border structure 245 as illustrated in FIG. 2. The center of the central space CP is located at the center 213 of the substrate 210. In some embodiments, the central space CP is divided into an outer ring area CP1 and an inner ring area CP2 surrounded by the outer ring area CP1. The boundary line BL between the outer ring area CP1 and the inner ring area CP2 may be a predetermined distance away from the fifth black border structure 245, wherein the predetermined distance ranges from about 1.0 mm to about 1.75 mm. In such embodiment, the inner ring area CP2 may include a number of patterns having IC design, and the outer ring area CP2 may include an image structure 235 which is used for collecting information for lithography enhancement (which will be described later).

In some embodiments, the widths of the black border structures gradually decrease in the direction toward the center 213 of the substrate 210. For example, as shown in FIG. 3, the width W1 from the inner edge 2412 to the outer edge 2411 of the first black border structure 241 is greater than the width W2 from the inner edge 2422 to the outer edge 2421 of the second black border structure 242. In addition, the width W2 from the inner edge 2422 and the outer edge 2421 of the second black border structure 242 is greater than the width W3 from the inner edge 2432 to the outer edge 2431 of the third black border structure 243. In some embodiments, the largest width (e.g., the width W1) of the black border structure is about 2 mm, and the smallest width (e.g., the width of the fifth black border structure) is about 1.7 mm.

Since the chief ray angle (CRAA) of the light from the source 12 (FIG. 1) gradually approaches 90 degrees in the center of exposure field, the penumbra effect in the edge region of the exposure field is constrained as the field size decreases. Therefore, the decrease in the width of the black border structures will not adversely affect the information-gathering process but provide extra space for disposing the image structures, and more information can be collected.

In some embodiments, as shown in FIG. 2, the absorber layer 230 is patterned to have a number of image structures, such as a first image structure 231, second image structure 232, third image structure 233, fourth image structure 234 and fifth image structure 235 each having patterns representing features to be patterned on the semiconductor wafer 30. The first image structure 231, the second image structure 232, the third image structure 233, the fourth image structure 234 and the fifth image structure 235 are located at the intervening spaces OP1, OP2, OP3, and OP4 and the outer ring area CP1 of the central space CP, respectively.

In some embodiments, the image structures 231, 232, 233, 234 and 235 and the black border structures 241, 242, 243, 244 and 245 are alternately arranged along a direction away from the center 213 of the substrate 210. For example, as shown in FIG. 3, the second image structure 232, the second black border structure 242, the first image structure 231 and the first black border structure 241 are arranged in order in a direction away from the center of the substrate.

In some embodiments, the image structures 231, 232, 233, 234 and 235 are respectively arranged so that they are adjacent to the inner edges of the black border structures 241, 242, 243, 244 and 245 that are located at the outer side (i.e., the side that is away from the center 213 of the substrate 210.) For example, as shown in FIG. 2, the first image structure 231 is arranged adjacent to the inner edge 2412 of the first black border structure 241, and the second image structure 232 is adjacent to the inner edge 2422 of the second black border structure 242 to facilitate an inspection of a field edge effect at the inner edges of the black border structures.

The image structures 231, 232, 233, 234 and 235 may entirely extend along the inner edges of the black border structures 241, 242, 243, 244 and 245. Alternatively, one or more of the image structures 231, 232, 233, 234 and 235 includes one or more sub-sections. The sub-sections of the images structures 231, 232, 233, 234 and 235 are separately dispersed in the intervening spaces OP1, OP2, OP3, and OP4 and the outer ring area CP1 of the central space CP. For example, the first images structure 231 may include four sub-sections separately located at four corners of the intervening space OP1, and each sub-sections may has an L-shape or a rectangular shape.

In the embodiment depicted, the absorber layers 230 and 240 are designed to absorb EUV radiation. A refractive index of the absorber layer 240 is higher than the refractive index of the absorber layer 230, and an extinction coefficient of the absorber layer 240 is higher than the extinction coefficient of the absorber layer 230.

In some embodiments, the absorber layer 230 and the absorber layer 240 include materials to achieve the refractive index and extinction coefficient differences. The absorber layer 230 includes a silver-containing material, and the absorber layer 240 includes a tantalum-containing material (for example, TaN, TaNH, TaHF, TaHfN, TaBSi, TaB—SiN, TaB, TaBN, TaSi, TaSiN, TaGe, TaGeN, TaZr, TaZrN, other tantalum-containing material, or combinations thereof). In the embodiment depicted, the absorber layer 230 is an Ag2O layer, and the absorber layer 240 is a TaBN layer. In one example, absorber layer 230 and absorber layer 240 each have a thickness of about 30 nm to about 40 nm.

In accordance with some embodiments, a method for forming the reticle shown in FIG. 2 and FIG. 3 are described below. For illustration, this method is described along with the schematic views shown in FIGS. 4-8. FIGS. 4-8 have been simplified for the sake of clarity to better understand the inventive concepts of the present disclosure.

The method for fabricating the reticle 20 includes providing a substrate 210. The method for fabricating the reticle 20 also includes forming a reflective multilayer 220 over the substrate 210. The method for fabricating the reticle 20 also includes forming a capping layer 222 over the reflective multilayer 220. The method for fabricating the reticle 20 also includes forming a buffer layer 224 over the capping layer 222. The method for fabricating the reticle 20 also includes forming an absorption stack 228 over the buffer layer 224. The absorption stack 228 may include an absorber layer 230 and an absorber layer 240.

The reflective multilayer 220, capping layer 222, buffer layer 224, absorber layer 230 and absorber layer 240 are formed by various methods, including physical vapor deposition (PVD) processes (for example, evaporation and DC magnetron sputtering), plating processes (for example, electroless plating or electroplating), chemical vapor deposition (CVD) processes (for example, atmospheric pressure CVD (APCVD), low pressure CVD (LPCVD), plasma enhanced CVD (PECVD), or high density plasma CVD (HDPCVD)), ion beam deposition, spin-on coating, metal-organic decomposition (MOD), another suitable method, or a combination thereof.

Figure 4:
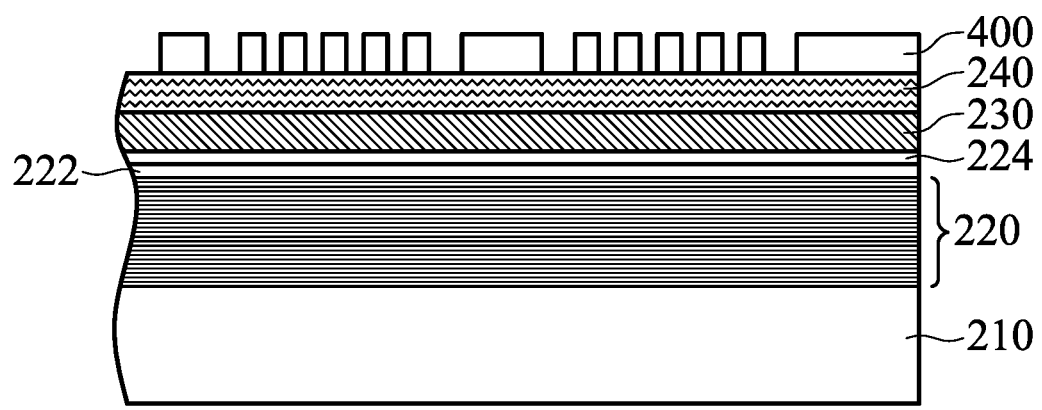
FIGS. 4, 5, 6, 7 and 8 are diagrammatic cross-sectional views of various stages of a method for manufacturing a reticle, in accordance with some embodiments.
Figure 5:
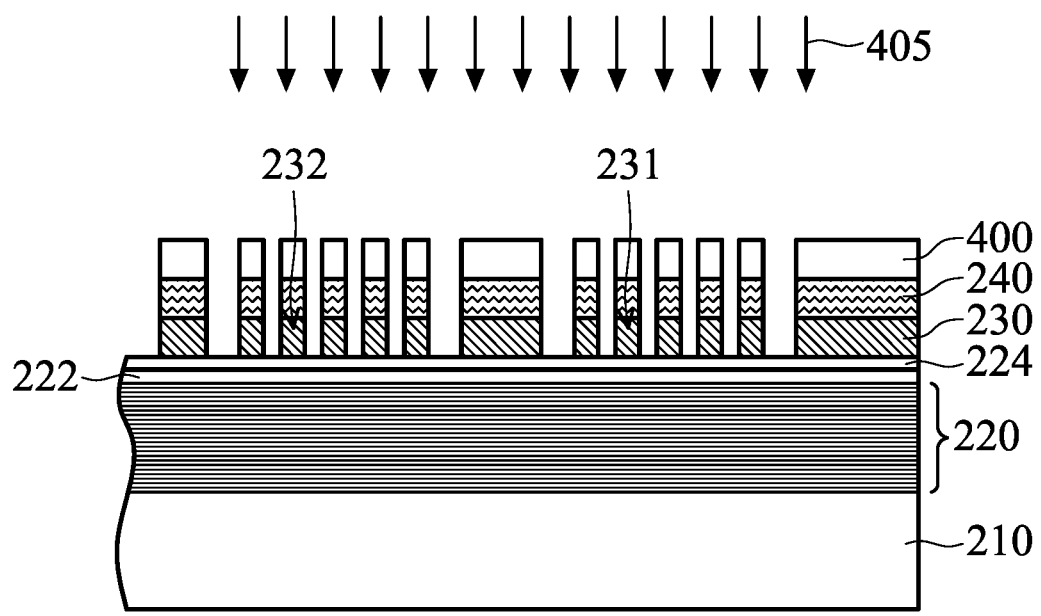

The method for fabricating the reticle 20 also includes patterning the absorber layer 230 and the absorber layer 240. (In some embodiments, as shown in FIG. 4 and FIG. 5, the absorber layer 230 is patterned to form image structures 231-235 and the absorber layer 240 is patterned to form black border structure 241-245.) In some embodiments, as shown in FIG. 4 a patterned resist layer 400 is formed over the absorber layer 240. Intervening spaces within the patterned resist layer 400 expose portions of the absorber layer 240 in an image region (i.e., the area above which the image structures are to be formed) of the substrate 210.

Afterwards, as shown in FIG. 5, an etching process 405 uses the patterned resist layer 400 as a mask, such that the exposed portions of the absorber layer 240 are removed in the image region of the substrate 210. The etching process 405 also removes portions of the absorber layer 230 underlying the exposed portions of the absorber layer 240 in the image region. Unexposed portions of the absorber layer 230 and the absorber layer 240 remain in a frame region (i.e., area above which the black border structures are to be formed) and the image region of the substrate 210.

The etching process 405 may include a dry etching process, a wet etching process, or combination thereof. The dry and wet etching processes have etching parameters that can be tuned, such as etchants used, etching temperature, etching solution concentration, etching pressure, source power, RF bias voltage, RF bias power, etchant flow rate, and other suitable parameters.

Figure 6:
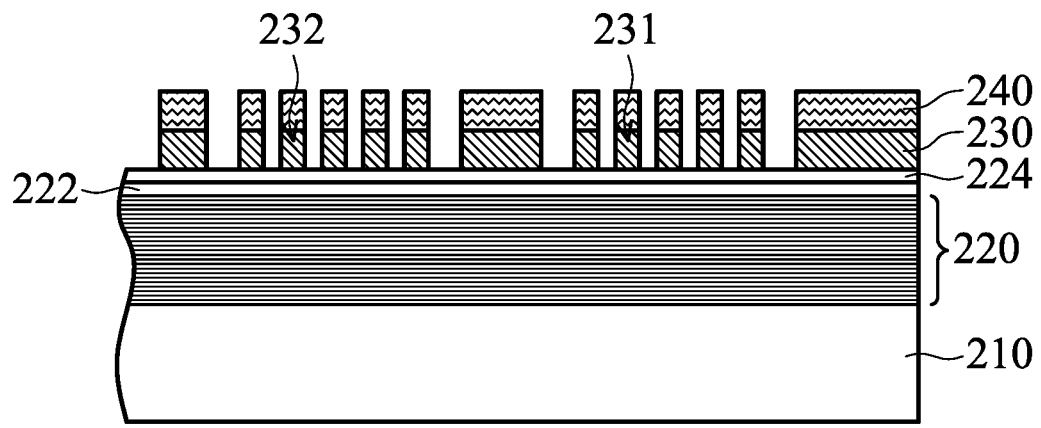

Thereafter, the patterned resist layer 400 is removed from the substrate 210, as illustrated in FIG. 6 (for example, by a resist stripping process), leaving patterned absorber layer 240 and patterned absorber layer 230. The patterned absorber layer 230 defines the image structures 231 and 232 on the substrate 210.

Figure 7:
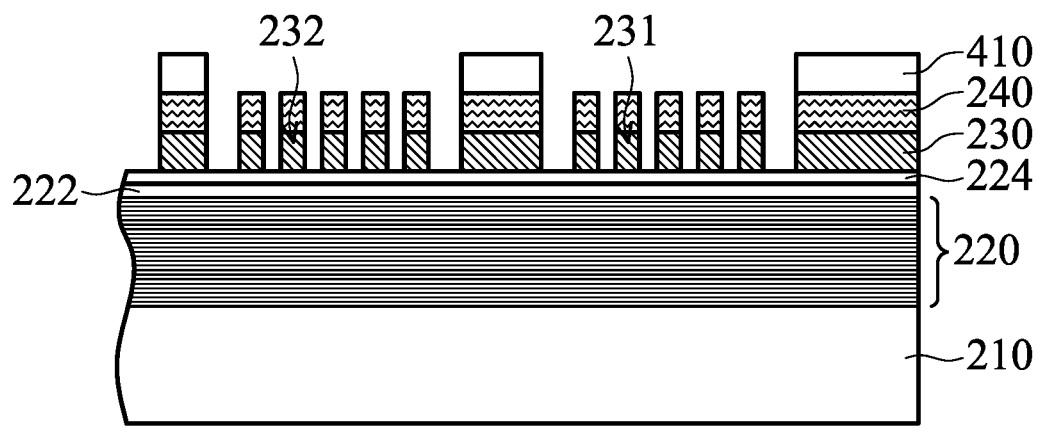
Figure 8:
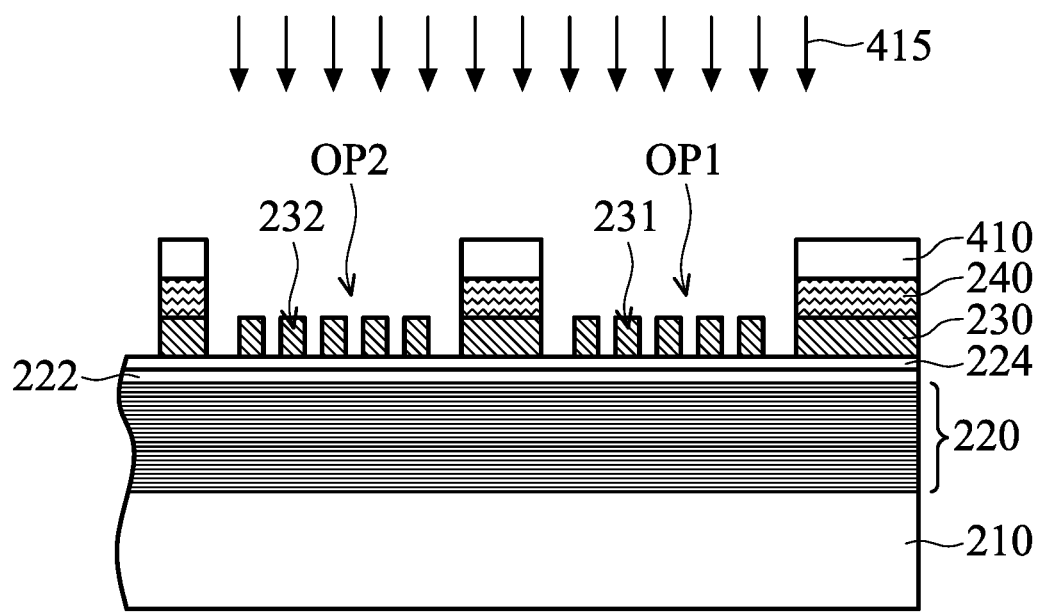

Afterwards, as shown in FIG. 7 and FIG. 8, the absorber layer 240 is removed from the image region of the substrate 210. In FIG. 7, a patterned resist layer 410 is formed over the absorber layer 240. Intervening spaces within the patterned resist layer 410 expose the absorber layer 230 in the image region of the substrate 210. The patterned resist layer 410 may be a radiation-sensitive resist layer that is responsive to an exposure process.

Afterwards, as shown in FIG. 8, an etching process 415 uses the patterned resist layer 410 as a mask, such that the exposed portions of the absorber layer 240 are removed in the image region of the substrate 210. As a result, the intervening spaces OP1 and OP2 are formed. The etching process 415 does not remove portions of the absorber layer 230 that underlie the exposed portions of the absorber layer 240 in the image region. Unexposed portions of the absorber layer 240 remain in the frame region of the reticle 20. The buffer layer 224 acts as an etch stop layer during the etching process 415. The etching process 415 thus selectively removes the absorber layer 240 without removing the absorber layer 230 or the buffer layer 224.

Afterwards, as shown in FIG. 3, the patterned resist layer 410 is removed from the reticle 20, for example, by a resist stripping process, leaving an absorptive stack 228 that includes the patterned absorber layer 240 and patterned absorber layer 230.

Figure 9:
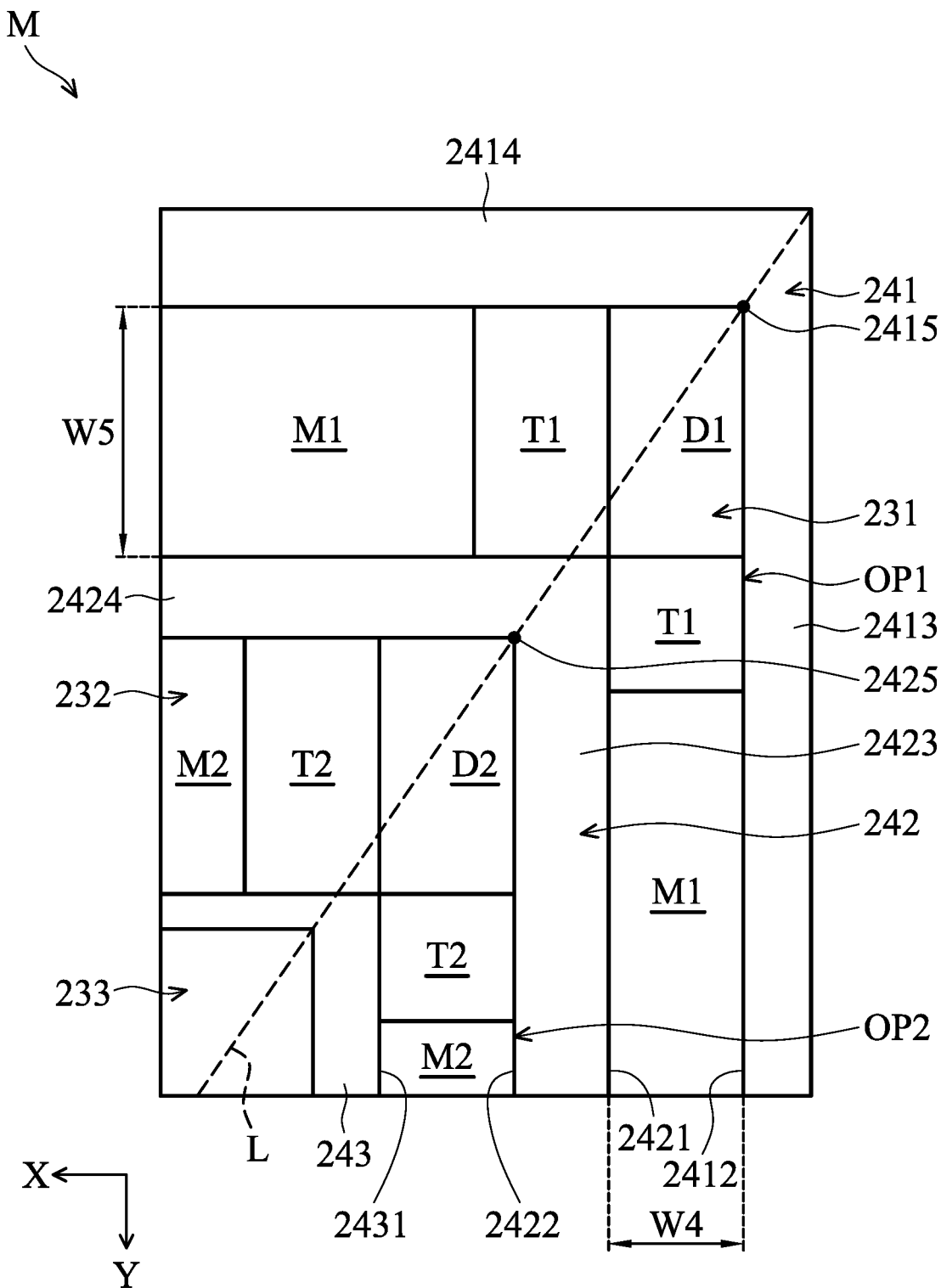
FIG. 9 is an enlarged partial view of area M of FIG. 2.

FIG. 9 shows an enlarged partial view of area M of FIG. 2. In some embodiments, the first image structure 231, the second image structure 232, the third image structure 233, the fourth image structure 234 and the fifth image structure 235 each include a number of patterns, in order to collect the optical performance of light projected around the edge of the corresponding black border structures.

For example, the first image structure 231 includes a dense pattern D1, two transitional patterns T1 and one or more OPC patterns M1. The dense pattern D1 is located adjacent to one of the corners, such as corner 2415, of the first black border structure 241 and arranged in a diagonal line L of the first black border structure 241.

The two transitional patterns T1 are arranged so that they are adjacent to two sides of the dense pattern D1. The two transitional patterns T1 are offset from the diagonal line L and arranged relative to the dense pattern D1 in two predetermined directions. The two predetermined directions are parallel to the extension direction of the two sides 2413 and 2414 of the first black border structure 241 that intersect at the corner 2415. The OPC patterns M1 are arranged at opposite sides of the two transitional patterns T1 that connect to the dense pattern D1.

In some embodiments, in directions perpendicular to the extension directions of the first black border structure 241, the dense pattern D1, the two transitional patterns T1 and the OPC patterns M1 each has a width that is the same as the width of the intervening space OP1. That is, the patterns of the first image structure 231 immediately adjacent to the inner edge 2412 of the first black border structure 241 and the outer edge 2421 of the second black border structure 242, as seen from a top view.

For example, the intervening space OP1 has a width W4 in the X-axis direction and a width W5 in the Y-axis direction. The dense pattern D1 has a width of W4 in the X-axis direction and a width of W5 in the Y-axis direction. In addition, the transitional patterns T1 which are located adjacent to the long side 2413 of the first black border structure 241 have a width of W4 and extend a predetermined distance, for example, about 1 mm. The transitional patterns T1 which are located adjacent to the short side 2414 of the first black border structure 241 have a width of W5 and extend a predetermined distance, for example, about 1 mm.

Moreover, the OPC pattern M1 which is located adjacent to the long side 2413 of the first black border structure 241 has a width of W4 and extends a predetermined distance, for example, about 6 mm. The OPC pattern M1 which is located adjacent to the short side 2414 of the first black border structure 241 has a width of W5 and extends a predetermined distance, for example, about 6 mm.

In addition, the second image structure 232 includes a dense pattern D2, two transitional patterns T2 and one or more OPC patterns M2, and the dense pattern D2 is located adjacent to one of the corners, such as corner 2425, of the second black border structure 242 and arranged along the diagonal line L of the second black border structure 242.

The two transitional patterns T2 are arranged so that they are adjacent to two sides of the dense pattern D2. The two transitional patterns T2 are offset from the diagonal line L and arranged relative to the dense pattern D2 in two predetermined directions. The two predetermined directions are parallel to the extension direction of the two sides 2423 and 2424 of the second black border structure 242 that intersect at the corner 2425. The OPC patterns M2 are arranged at opposite sides of the two transitional patterns T2 that connect to the dense pattern D2.

In some embodiments, in directions perpendicular to the extension directions of the second black border structure 242, the dense pattern D2, the two transitional patterns T2 and the OPC patterns M2 each has a width that is the same as the width of the intervening space OP2. That is, the patterns of the second image structure 232 immediately adjacent to the inner edge 2422 of the second black border structure 242 and the outer edge 2431 of the third black border structure 242, as seen from a top view.

It should be noted that the patterns of the first image structures 231 and the second image structures 232 should not be limited to the above mentioned embodiments. According to some simulations, the highest CD change (i.e. most adverse impact by black border effect) tends to occur at the corners of the black border structures. Therefore, other patterns rather than the dense pattern can be positioned at the corners of the black border structure, so as to collect information regarding the impact of the black border effect.

For example, the transitional pattern T1 is located adjacent to corners of the first black border structure 241 and arranged in a diagonal line L of the first black border structure 241. The dense pattern D1 or the OPC patterns M1 is connected to either side of the transitional pattern T1. Alternatively, the OPC patterns M1 may be located adjacent to corners of the first black border structure 241 and arranged in a diagonal line L of the first black border structure 241. The dense pattern D1 or the transitional pattern T1 is connected to either side of the OPC patterns M1.

Figure 10:
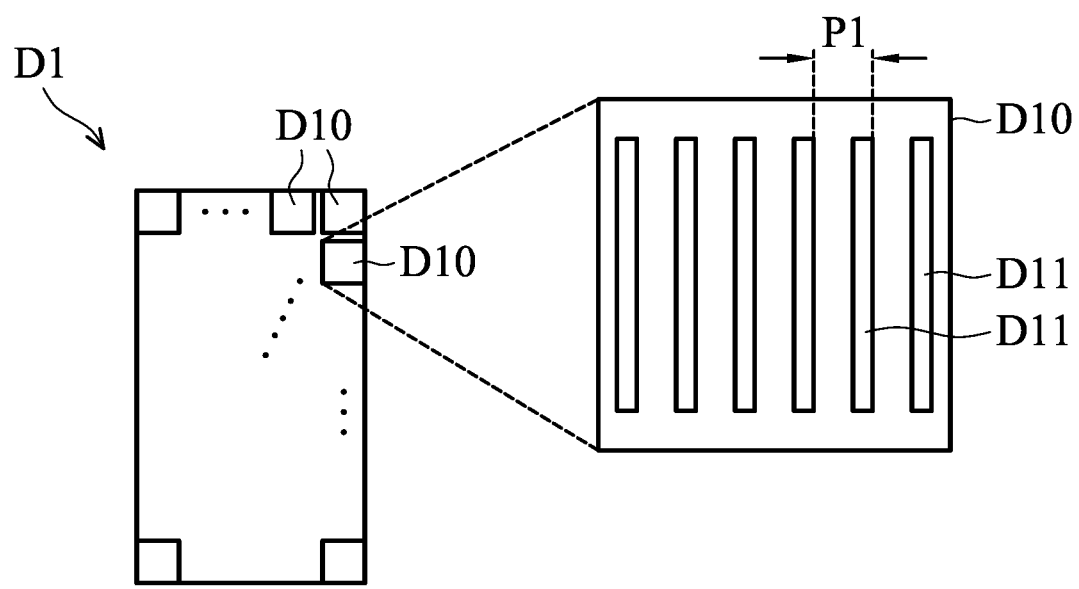
FIG. 10 is a schematic view of a dense pattern D1, in accordance with some embodiments.

FIG. 10 shows a schematic view of the dense pattern D1, in accordance with some embodiments. In some embodiments, the dense pattern D1 includes a number of dense cells D10. The dense cells D10 are arranged in a matrix at a pitch of, for example, about 6 um. Each of the dense cells D10 has a rectangular shape with dimensions about 3*3 mm$^2$ and includes a number of features D11 (such as lines) regularly arranged at a first pitch P1.

In some embodiments, the dense pattern D1 has the highest density of the features in the first image structure 231. Since shadowing effects and/or mask black border effects are manifested in the position around the corner 2415, by placing the dense pattern D1 at the corner 2415, deflection of the light at the corner 2415 can be accurately detected.

Figure 11:
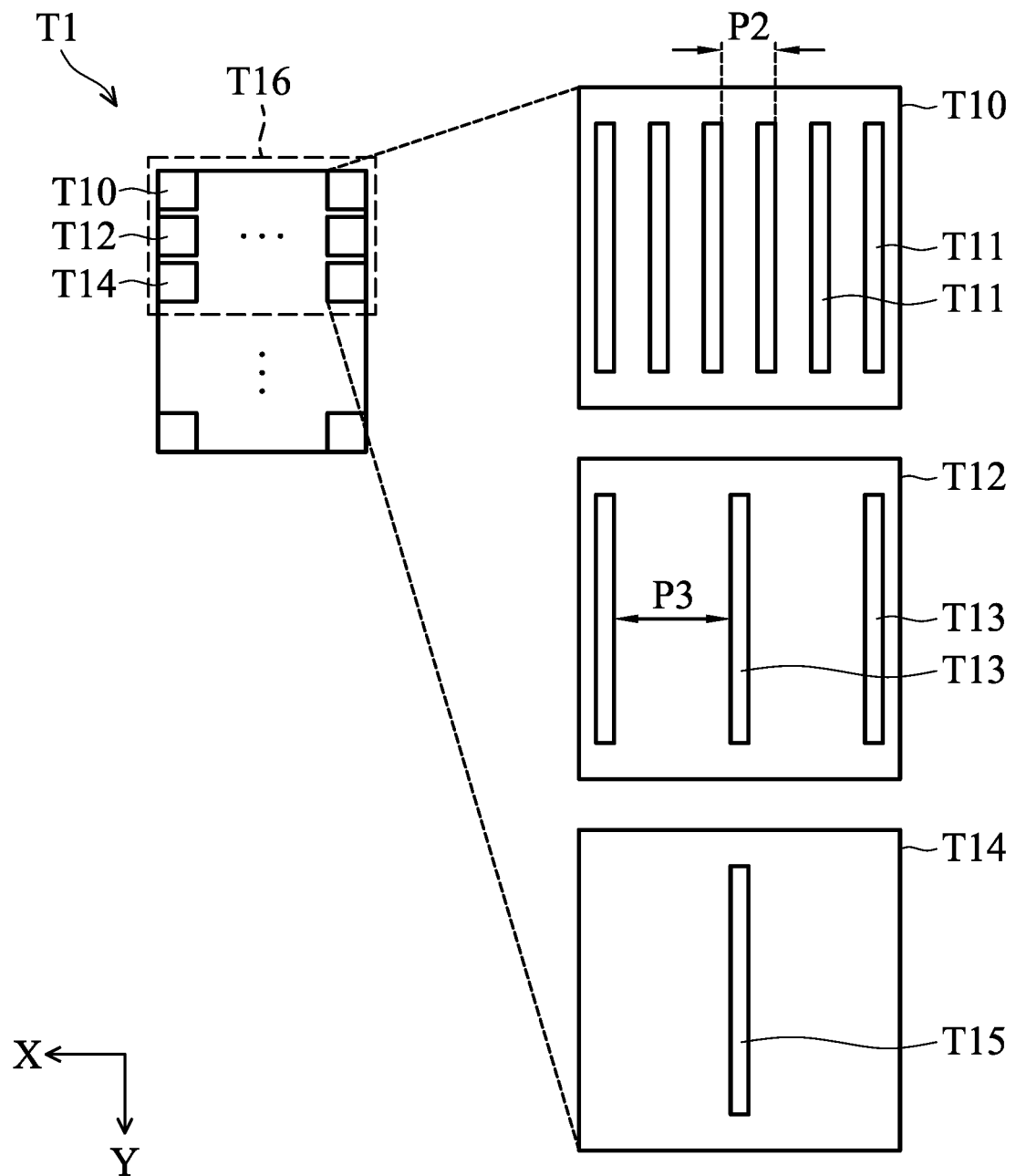
FIG. 11 is a schematic view of a transitional pattern T1, in accordance with some embodiments.

FIG. 11 shows a schematic view of the transitional pattern T1, in accordance with some embodiments. In some embodiments, the transitional pattern T1 includes a number of transition cells, such as transitional cells T10, T12 and T14. The transitional cells T10, T12 and T14 are arranged along a direction that is parallel to the extension direction of the first black border structure 241 (FIG. 9).

In some embodiments, feature density in the first image structure 231 gradually decreases in a direction moving away from the corners 2415 of the first black border structure 241. For example, along the direction parallel to the extension direction of the first black border structure 241 (i.e., a direction away from the corner 2415), the transitional cells T10, T12 and T14 have different feature densities and gradually decreases along the Y-axis direction. The transitional cell T10 includes six features T11 arranged regularly at a pitch P2. The transitional cell T12 includes three features T13 arranged regularly at a pitch P3. The transitional cell T14 includes one feature T15. The pitch P2 may be equal to or less than the pitch P1 of the features in dense cell D10. The pitch P3 is less than the pitch P2 of the features T11 in the transitional cell T10. Because the dense pattern D1 is located adjacent to the corner 2415 and the transitional pattern T1 is located a distance away from the corner 2415, the dense pattern D1 suffers more light leakage from the transitional pattern T1. As a result, using an arrangement that increases feature density in a direction away from the corner will result in image-error compensation with greater accuracy.

In some embodiments, the transitional pattern T1 includes a number of groups T16 of the transitional cells T10, T12 and T14. The groups T16 of the transitional cells T10, T12 and T14 are sequentially arranged along a direction that is parallel to the extension direction of the first black border structure 241. The transitional pattern T1 may include fifteen groups of transitional cells T10, T12 and T14. With the groups T16 of transitional cells T10, T12 and T14, shadowing effects and/or mask black border effects around the first black border structure 241 can be monitored.

Figure 12A:
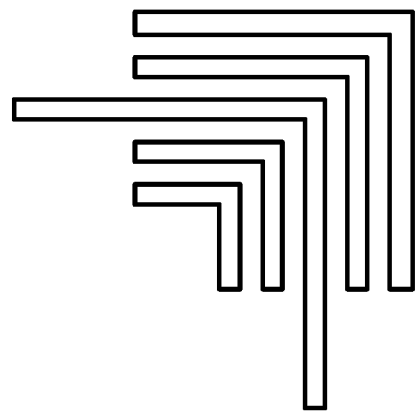
FIG. 12A shows a schematic view illustrating an IC design, in accordance with some embodiments.
Figure 12B:
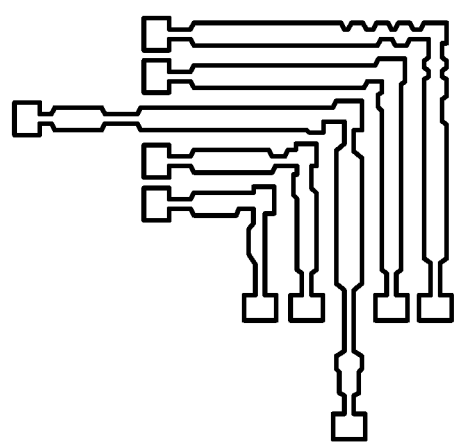
FIG. 12B shows a schematic view illustrating an OPC patterns, in accordance with some embodiments.

In some embodiments, OPC patterns M1 includes a number of patterns having a modified IC design to compensate for the field edge effect so that the shape of the feature as formed in the final integrated circuit or test wafer closely matches the shape of the feature in the IC design layout. FIG. 12A shows a schematic view illustrating an IC design. FIG. 12B shows a schematic view illustrating an OPC patterns M1 incorporating an OPC technique. As shown in FIGS. 12A and 12B, the OPC patterns M1 is added various assist features, such as scattering bars, serifs or hammerheads, to the IC design.

In some embodiments, the OPC patterns may include a number of modified IC designs with different compensation. The dimensions of the modified IC design satisfies the equation $Wn=W_{original}+(CA*Cn)$, wherein original is the width of a critical feature in an original IC design, CA is the compensation amount, Cn is the compensation index, and Wn is the width of a critical feature in a modified IC design. In such embodiment, the OPC patterns may include six modified IC designs with different compensated widths. The first-step OPC pattern has a width that satisfies the equation $W1=W_{original}+(CA*C1)$, where C1 may be 1. The second-step OPC pattern has a width that satisfies the equation $W2=Woriginal+(CA*C2)$, where C2 may be 0.7-0.9.

Figure 13:
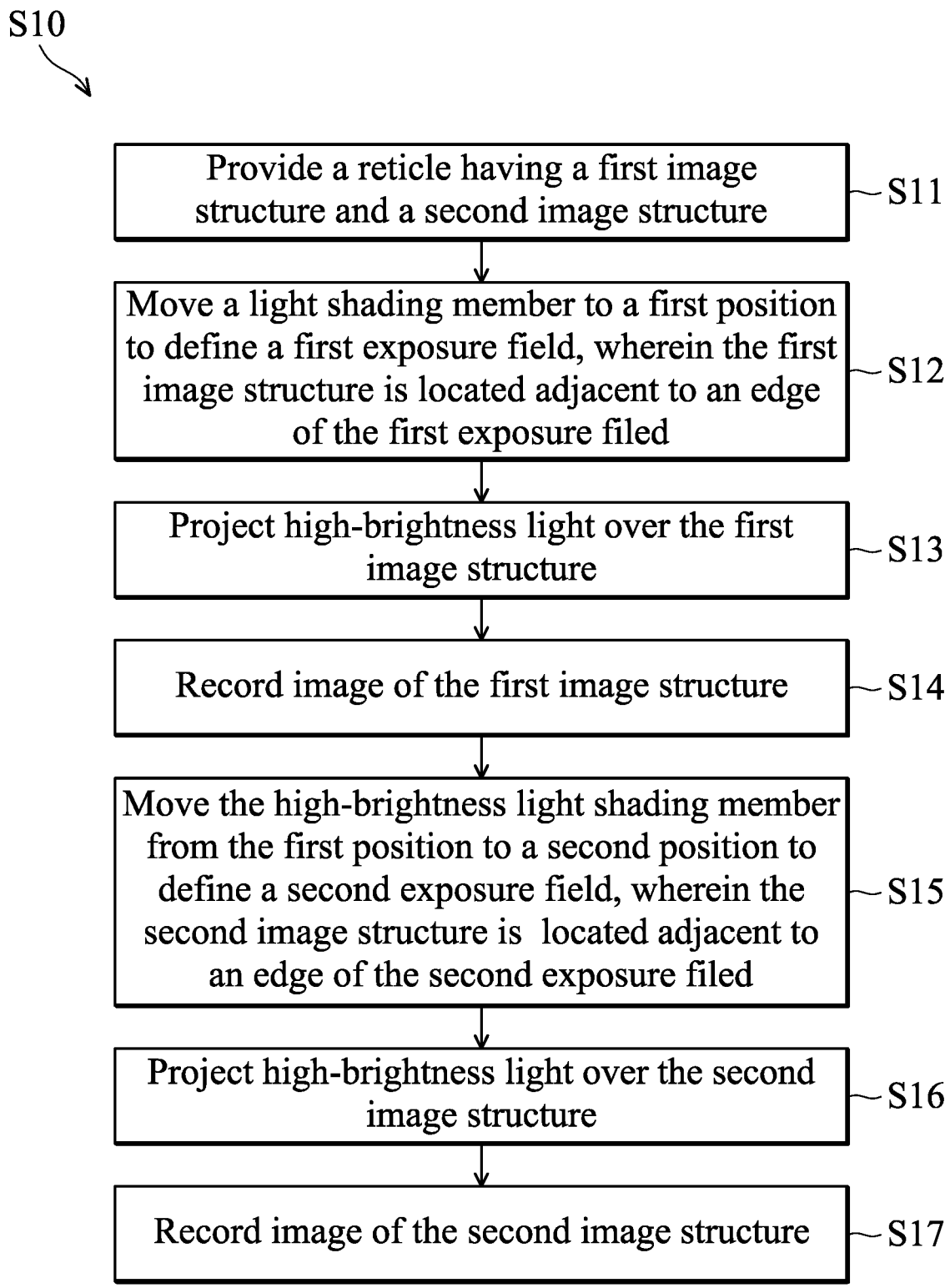
FIG. 13 is a flow chart illustrating a method for collecting information used in image-error compensation, in accordance with some embodiments.

FIG. 13 is a flow chart illustrating a method S10 for collecting information used in image-error compensation, in accordance with some embodiments. For illustration, the flow chart of FIG. 13 will be described along with the schematic views shown in FIGS. 14-15. Some of the stages described can be replaced or eliminated for different embodiments.

The method S10 includes operation S11, in which a reticle 20 is provided. In some embodiments, the reticle 20 may be placed on the reticle stage 16 and fixed on the reticle stage 16 by electrostatic force. When the reticle 20 is placed on the reticle stage 16, the front surface (i.e., the surface where the image structures and the black border structures are disposed) faces downward.

The method S10 also includes operation S12, in which a light shading member 40 is moved to a first position that is below the reticle 20 so as to control a first exposure field. In some embodiments, the light shading member 40 includes a number of blades, such as four blades positioned relative to the four sides of the first black border structure 241, such that a rectangular exposure field which is to be exposed by the light is defined.

Figure 14:
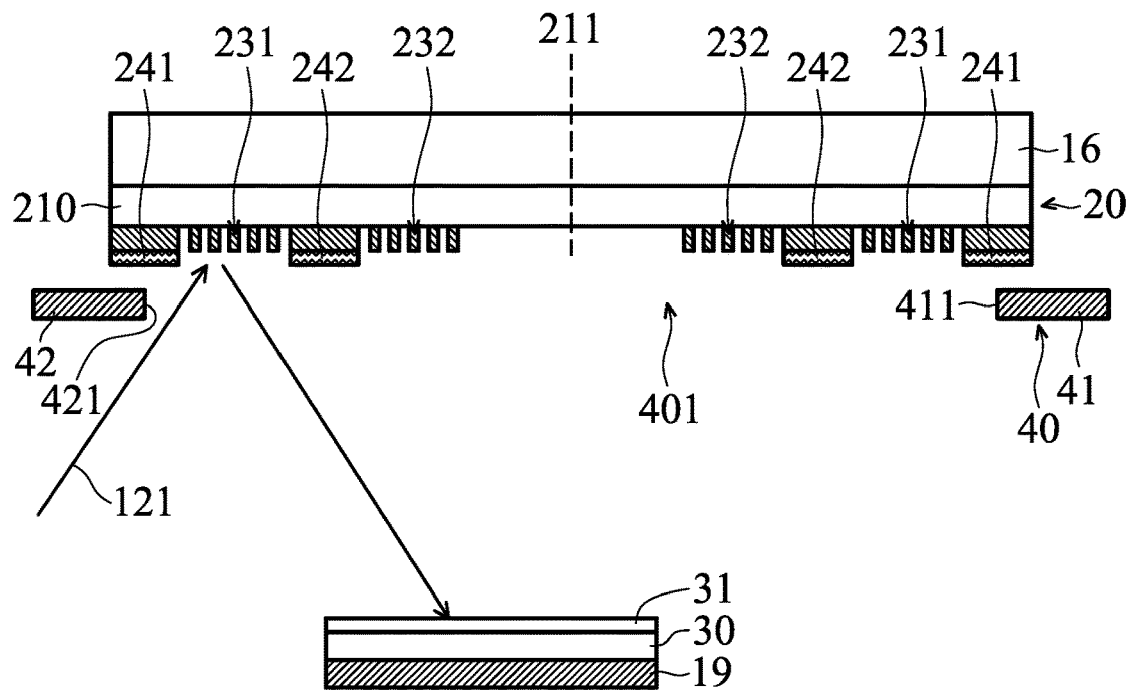
FIG. 14 is a diagrammatic cross-sectional views of a stage of the method of FIG. 13 in which the light shading member is placed in a first position, in accordance with some embodiments.

For example, as shown in FIG. 14, two blades 41 and 42 of the light shading member are located below the reticle 20. When the light shading member 40 is moved to a first position, the inner edges 411 and 421 of the blades 41 and 42 is aligned with the first black border structure 241, and the projections of the inner edges 411 and 421 of the blades 41 and 42 are located on the first black border structure 241. Therefore, a first exposure field 401 is defined, and the first image structure 231 is located at the edge of the first exposure field 401 and adjacent to the inner edges 411 and 421.

The method S10 also includes operation S13, in which a light 121 is projected on the first ag structure 231. In some embodiments, the light 121, such as EUV light, is projected on the first exposure field and is reflected by reflective multilayer underlying the first image structures 231.

The method S10 also includes operation S14, in which an image of the first image structure 231 is recorded. In some embodiments, the light reflected from the reticle 20 is directed to the resist layer 31 coated on the semiconductor wafer 30. Afterwards, a developing process is performed on the resist layer 31, and an etch process is performed on a material layer underlying the resist layer 31 using the patterned resist layer 31 as an etch mask. Afterwards, the resist layer 31 is removed, and an image of the first image structures 231 is transferred to the material layer. By observing the pattern material layer using, for example, a scanning electron microscope (SEM), the image of the first image structures 231 is recorded.

The method S10 also includes operation S15, in which a light shading member 40 is moved to a second position from the first position so as to control a second exposure field. In some embodiments, the blades of the light shading member 40 are positioned relative to the four sides of the second black border structure 242, such that a rectangular exposure field which is to be exposed by the light is defined.

Figure 15:
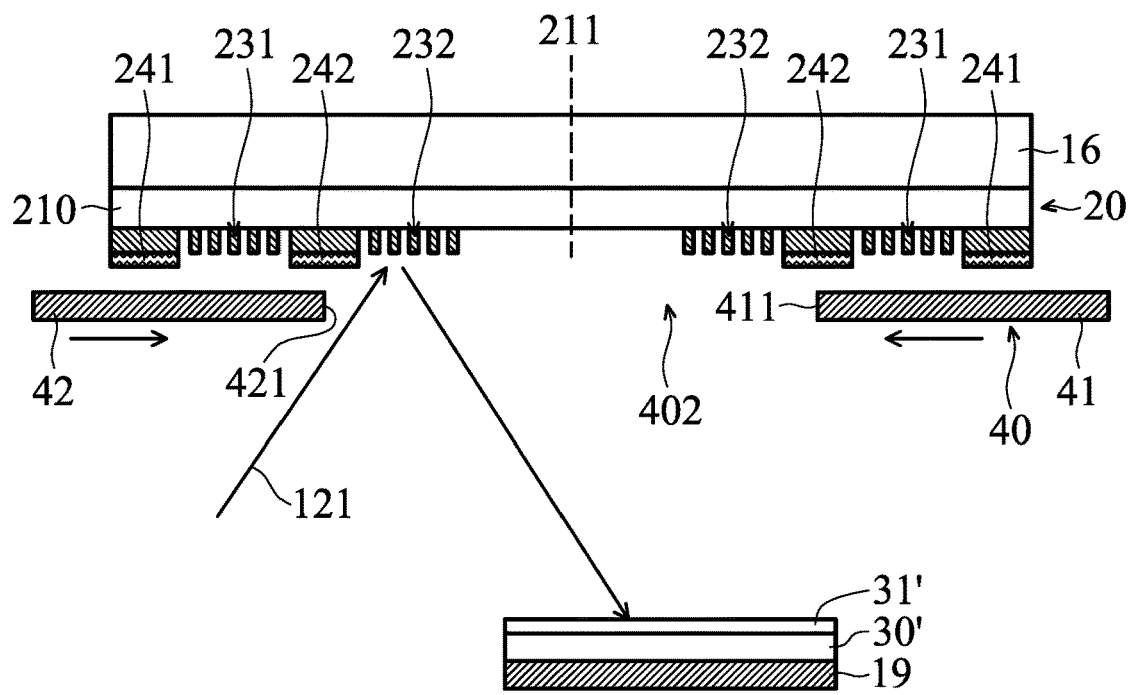
FIG. 15 is a diagrammatic cross-sectional view of a stage of the method of FIG. 13 in which the light shading member is placed in a second position, in accordance with some embodiments.

For example, as shown in FIG. 15, two blades 41 and 42 of the light shading member are located below the reticle 20. When the light shading member 40 is moved to a second position, the inner edges 411 and 421 of the blades 41 and 42 are aligned with the second black border structure 242, and the projections of the inner edges 411 and 421 of the blades 41 and 42 are located on the second black border structure 242. Therefore, a second exposure field 402 is defined, and the second image structure 232 is located at the edge of the second exposure field 402 and adjacent to the inner edges 411 and 421.

The method S10 also includes operation S16, in which light 121 is projected on the second image structure 232. In some embodiments, the light 121 is projected on the second exposure field 402 and is reflected by a reflective multilayer underlying the image structures 231.

The method S10 also includes operation S17, in which an image of the second image structure 232 is recorded. In some embodiments, the light reflected from the reticle 20 is directed to the resist layer 31' coated on the semiconductor wafer 30' which is different from the semiconductor wafer 30 shown in FIG. 1. Afterwards, a developing process is performed on the resist layer 31', and an etch process is performed on a material layer underlying the resist layer 31' using the patterned resist layer 31' as an etch mask. Afterwards, the resist layer 31' is removed, and the image of the second image structure 232 is transferred to the material layer. By observing the pattern material layer using, for example, a scanning electron microscope (SEM), the image of the second image structures 232 is recorded.

In some embodiments, after the images of the first and second image structures 231 and 232 are recorded, an images analysis is performed. The image analysis may compare the images of the first and second image structures 231 and 232 to data associated with the layout of the image structures of the reticle 20, and determine the difference between the images and the data. Afterwards, the differences are used to determine the compensation amount to the IC design (or layout) formed on the corresponding image field, especially for an IC design formed on the edge region including corner region of the corresponding image field.

Afterwards, enhancements to the desired pattern layout are made to increase the fidelity of the transferred pattern. The enhancements entail modifications to the desired pattern layout, which may cause a new computer-readable file to be generated. The enhancements may include the addition of OPC features, sub-resolution assist features (SRAFs), and/or other features. Afterwards, a reticle is created using the enhanced desired pattern layout and is used to process a semiconductor wafer on which devices are formed. Since the patterns on the reticle have been modified, image distortion due to the penumbra effect at the edge region of the exposure field can be compensated for accurately according to the corresponding field size.

Embodiments of a method for collecting information for lithography enhancement use a reticle to measure out-of-band (OOB) effect in exposure fields of different sizes. The parameter for image-error compensation can be modified accordingly. As a result, the non-uniformity during the lithography exposure process could be compensated for and improved upon. Compared with a conventional method in which a number of reticles each has a particular field size are used for collecting information, this method can gather information about exposure fields having different field sizes without replacing the reticle. Therefore, efficiency is improved and the manufacturing cost is reduced.

In accordance with some embodiments, a method for collecting information in image-error compensation includes providing a reticle having a first image structure and a second image structure; moving a light shading member to control a first exposure field; projecting a light over the first exposure field; recording an image of the first image structure after the light is projected; moving the light shading member to control a second exposure field; projecting the light over the second exposure field; and recording an image of the second image structure after the light is projected.

In accordance with some embodiments, a method for collecting information in image-error compensation includes providing a reticle having a plurality of image structures; moving a light shading member below the reticle; projecting a light over the image structures; and recording a plurality of images of the image structures. The reticle includes a plurality of black border structures arranged in order in a direction away from the center of the reticle.

In accordance with some embodiments, a method for collecting information in image-error compensation includes providing a reticle having a first image structure and second image structure; moving a light shading member to a first position to define a first exposure field, wherein the first image structure is located adjacent to an edge of the first exposure field; projecting a light over the first image structure when the light shading member is in the first position; recording an image of the first image structure; moving the light shading member from the first position to a second position to define a second exposure field, wherein the second image structure is located adjacent to an edge of the second exposure field; projecting the light over the second image structure when the light shading member is in the second position; and recording an image of the second image structure.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for collecting information in image-error compensation, comprising:
    providing a reticle having a first image structure and a second image structure;
    moving a light shading member to control a first exposure field;
    projecting a light over the first exposure field;
    recording an image of the first image structure after the light is projected;
    moving the light shading member to control a second exposure field;
    projecting the light over the second exposure field; and
    recording an image of the second image structure after the light is projected.

2. The method as claimed in claim 1, wherein the reticle further comprises a first black border structure and a second black border structure formed over the reticle and arranged around the center of the reticle.

3. The method as claimed in claim 2, wherein the first black border structure and the second black border structure are disposed on a front surface of the reticle.

4. The method as claimed in claim 3, wherein the front surface of the reticle faces toward a semiconductor wafer.

5. The method as claimed in claim 2, wherein the light shading member comprises two blades, and inner edges of the blades are aligned with the first black border structure.

6. The method as claimed in claim 5, wherein projections of the inner edges of the blades are located on the first black border structure.

7. The method as claimed in claim 2, wherein the light shading member comprises two blades, and inner edges of the blades are aligned with the second black border structure.

8. The method as claimed in claim 7, wherein projections of the inner edges of the blades are located on the second black border structure.

9. The method as claimed in claim 1, wherein the first image structure and the second image structure are disposed on a front surface of the reticle.

10. The method as claimed in claim 9, wherein the front surface of the reticle faces toward a semiconductor wafer.

11. A method for collecting information in image-error compensation, comprising:
    providing a reticle having a plurality of image structures;
    moving a light shading member below the reticle;
    projecting a light over the image structures; and
    recording a plurality of images of the image structures;
    wherein the reticle comprises a plurality of black border structures arranged in order in a direction away from the center of the reticle.

12. The method as claimed in claim 11, wherein the black border structures are rectangular with sides correspondingly parallel to edges of the reticle.

13. The method as claimed in claim 11, wherein widths of the black border structures are different.

14. The method as claimed in claim 11, wherein the black border structures are concentric with a center of the reticle.

15. The method as claimed in claim 11, wherein a plurality of dense patterns are formed over the reticle and arranged at a corner the black border structures.

16. The method as claimed in claim 15, wherein the dense patterns each comprises a plurality of dense cells each having a plurality of regularly spaced features.

17. A method for collecting information in image-error compensation, comprising:
 providing a reticle having a first image structure and second image structure;
 moving a light shading member to a first position to define a first exposure field, wherein the first image structure is located adjacent to an edge of the first exposure field;
 projecting a light over the first image structure when the light shading member is in the first position;
 recording an image of the first image structure;
 moving the light shading member from the first position to a second position to define a second exposure field, wherein the second image structure is located adjacent to an edge of the second exposure field;
 projecting the light over the second image structure when the light shading member is in the second position; and
 recording an image of the second image structure.

18. The method as claimed in claim 17, wherein the reticle further comprises a first black border structure and a second black border structure formed over a substrate and arranged around the center of the substrate;
 wherein the inner edge of the light shading member is aligned with the first black border structure while the light shading member is in the first position, and the inner edge of the light shading member is aligned with the second black border structure while the light shading member is in the second position.

19. The method as claimed in claim 17, further comprising performing an image analysis on the images of the first image structure and the second image structure to determine differences between the images of the first image structure and the second image structure and data associated with layouts of the first image structure and the second image structure.

20. The method as claimed in claim 17, wherein the high-brightness light comprises an EUV (extreme ultraviolet) light.

* * * * *